(12) United States Patent
Kato

(10) Patent No.: US 10,246,775 B2
(45) Date of Patent: Apr. 2, 2019

(54) FILM FORMING APPARATUS, METHOD OF FORMING FILM, AND STORAGE MEDIUM

(71) Applicant: TOKYO ELECTRON LIMITED, Tokyo (JP)

(72) Inventor: Hitoshi Kato, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/661,476

(22) Filed: Jul. 27, 2017

(65) Prior Publication Data
US 2018/0037990 A1 Feb. 8, 2018

(30) Foreign Application Priority Data

Aug. 3, 2016 (JP) .................................. 2016-153155
May 26, 2017 (JP) .................................. 2017-104547

(51) Int. Cl.
| | | |
|---|---|---|
| C23C 16/455 | (2006.01) | |
| H01L 21/02 | (2006.01) | |
| H01L 21/687 | (2006.01) | |
| C23C 16/34 | (2006.01) | |

(52) U.S. Cl.
CPC ...... *C23C 16/45527* (2013.01); *C23C 16/345* (2013.01); *C23C 16/45542* (2013.01); *C23C 16/45544* (2013.01); *C23C 16/45551* (2013.01); *C23C 16/45578* (2013.01); *H01L 21/0217* (2013.01); *H01L 21/0228* (2013.01); *H01L 21/68764* (2013.01); *H01L 21/68771* (2013.01)

(58) Field of Classification Search
CPC ........ C23C 16/45527; C23C 16/45544; C23C 16/345; C23C 16/45578; C23C 16/45542; C23C 16/45551; H01L 21/0217; H01L 21/68771; H01L 21/68764; H01L 21/0228
See application file for complete search history.

(56) References Cited

U.S. PATENT DOCUMENTS

2016/0284532 A1* 9/2016 Ueda ................. H01L 21/02164

FOREIGN PATENT DOCUMENTS

| JP | 2007-247066 A | 9/2007 |
|---|---|---|
| JP | 2013-161874 A | 8/2013 |

* cited by examiner

*Primary Examiner* — Jasmine Clark
(74) *Attorney, Agent, or Firm* — Nath, Goldberg & Meyer; Jerald L. Meyer

(57) ABSTRACT

An apparatus for forming a thin film on a substrate in a processing container under vacuum atmosphere by alternately supplying a first gas and a second gas, which are process gases, onto the substrate, including: n first processing regions spaced from each other along circumferential direction of the processing container and used to process the substrate by supplying the first gas; n second processing regions formed between the n first processing regions along the circumferential direction and used to process the substrate by supplying the second gas; an isolation part isolating the n first processing regions and the n second processing regions; mounting parts disposed to be revolved along the circumferential direction and used to mount substrates; and a control part intermittently revolving mounting parts so that the substrates are alternately located in the n first processing regions and the n second processing regions while a revolution is stopped.

14 Claims, 19 Drawing Sheets

FILM FORMING APPARATUS, METHOD OF FORMING FILM, AND STORAGE MEDIUM

CROSS-REFERENCE TO RELATED APPLICATIONS

This application is based upon and claims the benefit of priority from Japanese Patent Application No. 2016-153155, filed on Aug. 3, 2016, and Japanese Patent Application No. 2017-104547, filed on May 26, 2017, the entire contents of which are incorporated herein by reference.

TECHNICAL FIELD

The present disclosure relates to a technical field in which a first gas and a second gas which are process gases are alternately supplied onto a substrate to perform a process of forming a film.

BACKGROUND

As one of methods of forming a thin film such as a silicon nitride film on a semiconductor wafer (hereinafter referred to as "wafer"), a so-called ALD (Atomic Layer Deposition) method of sequentially supplying a thin film precursor gas and a reaction gas reacting with the precursor gas onto the surface of the wafer to laminate reaction products is known. As one example of a film forming apparatus for performing a film forming process using this ALD method, an apparatus is known in which a rotary table for revolving a plurality of wafers arranged in the circumferential direction is installed inside a vacuum container and a plurality of gas supply nozzles are installed so as to face the rotary table. In this apparatus, an isolation region to which an isolation gas is supplied to prevent the process gases from being mixed with each other is formed between the process regions to which the process gases are respectively supplied. Further, a region for activating a reaction gas by using plasma and a region for modifying a thin film by using plasma are formed apart from each other in the circumferential direction.

The above-described film forming apparatus is of a so-called semi-batch type in which a plurality of substrates is mounted on the rotary table to perform a film forming process, and has advantages of providing substrates with good in-plane uniformity and an increased throughput. In the industry, however, it is desired to further improve the productivity in the apparatus of such type.

There has been also conventionally proposed an apparatus in which four semiconductor target substrates are mounted and an upper region of a rotatable table is divided into four regions by partitions. This proposed apparatus may be effective in terms of a self-saturation reaction such as the ALD, but it does not manifest its operation method and does not suggest the present disclosure.

SUMMARY

Some embodiments of the present disclosure provide a technique capable of achieving high productivity in performing a film forming process by supplying a first gas and a second gas alternately onto a substrate.

According to another embodiment of the present disclosure, an apparatus forms a thin film on a substrate in a processing container under a vacuum atmosphere by performing a cycle a predetermined number of times, where the cycle including alternately supplying a first gas and a second gas, which are process gases, onto the substrate. The apparatus includes: n first processing regions (n being an integer of 2 or more) which are spaced from each other along a circumferential direction of the processing container, and are used to process the substrate by supplying the first gas; n second processing regions which are formed between the n first processing regions along the circumferential direction, and are used to process the substrate by supplying the second gas; an isolation part which isolates the n first processing regions and the n second processing regions from each other; a plurality of mounting parts which are disposed to be revolved along the circumferential direction and are used to mount substrates, respectively; and a control part configured to intermittently revolve the plurality of mounting parts so that the substrates are alternately located in the n first processing regions and the n second processing regions in a state where a revolution is stopped, wherein the plurality of mounting parts are disposed so that a first number of substrates located in the n first processing regions is the same as a second number of substrates located in the n second processing regions when the revolution of the plurality of mounting parts is stopped.

According to another embodiment of the present disclosure, a method of forming a thin film on a substrate in a processing container under a vacuum atmosphere includes: forming, in the processing container, n first processing regions (n being an integer of 2 or more) spaced from each other along the circumferential direction of the processing container and n second processing regions along the circumferential direction with an isolation part interposed between the n first processing regions and the n second processing regions; installing 2n×m (m being an integer of 1 or more) mounting parts which are disposed to be revolved along a circumferential direction and are used to mount substrates, respectively; and repeating a cycle a predetermined number of time, the cycle including: (1) mounting the substrates on the mounting parts; (2) supplying a first gas and a second gas, which are process gases, into the n first processing regions and the n second processing regions, respectively, in a state where a revolution of the mounting parts is stopped so that the substrates are located in each of the n first processing regions and the n second processing regions; subsequently revolving the mounting parts to locate the substrates, which were located in each of the n first processing regions and the n second processing regions, in adjacent processing regions; and thereafter supplying the first gas and the second gas into the n first processing regions and the n second processing regions, respectively, in a state where the revolution of the mounting parts is stopped.

A non-transitory computer-readable storage medium is provided which stores a computer program used for a film forming apparatus for forming a thin film on a substrate in a processing container forming a vacuum atmosphere by performing a cycle a predetermined number of times, the cycle including alternately supplying a first gas and a second gas onto the substrate. The computer program comprising a group of steps so as to execute the film forming method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Outline of Embodiment of the Present Disclosure

Figure 1:
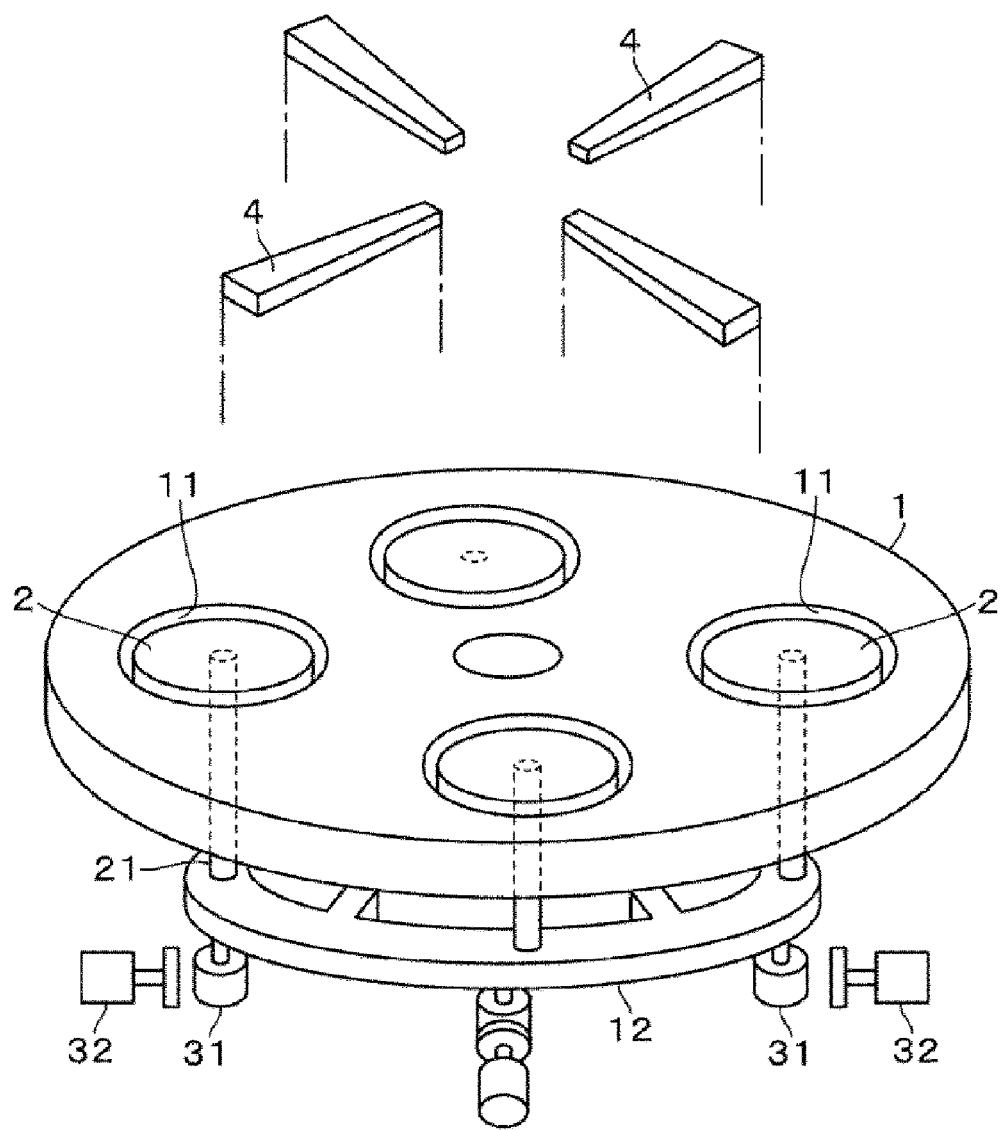
FIG. 1 is a perspective view schematically showing a structure of main parts of a film forming apparatus according to a first embodiment of the present disclosure.

The outline of an embodiment of the present disclosure will be described. A film forming apparatus used in this embodiment includes a rotary table made of, e.g., quartz and installed in a processing container which is a vacuum container. FIG. 1 schematically shows a rotary table 1 and its peripheral portions. Four circular recesses 11 are formed at equal intervals in the circumferential direction on the upper surface of the rotary table 1 and a mounting table 2 forming a mounting part on which a wafer as a substrate is mounted is disposed in each of the recesses 11. A rotary support 12 having a circular outer shape concentric with the rotary table 1 is installed below of the rotary table 1. The rotary table 1 is supported on the rotary support 12 via a support member (not shown in FIG. 1). The rotary support 12 can be rotated by a rotary shaft (not shown in FIG. 1) and the rotary table 1 is rotated together with the rotation of the rotary support 12, for example, in a clockwise direction.

The mounting table 2 is attached to the upper end of a rotation axis 21 which penetrates the central portion of the recess 11 and is rotatably supported to the rotary support 12. A driven gear part 31 made of a magnet is installed on the lower end portion of the rotation axis 21 and a driving gear part 32 made of a magnet for rotating the driven gear part 31 in a noncontact manner is installed on the processing container side corresponding to a stop position of the rotary table 1. The rotation axis 21 is rotated through the driven gear part 31 by the rotation of the driving gear part 32, whereby the mounting table 2 is rotated on its own axis.

Figure 6:
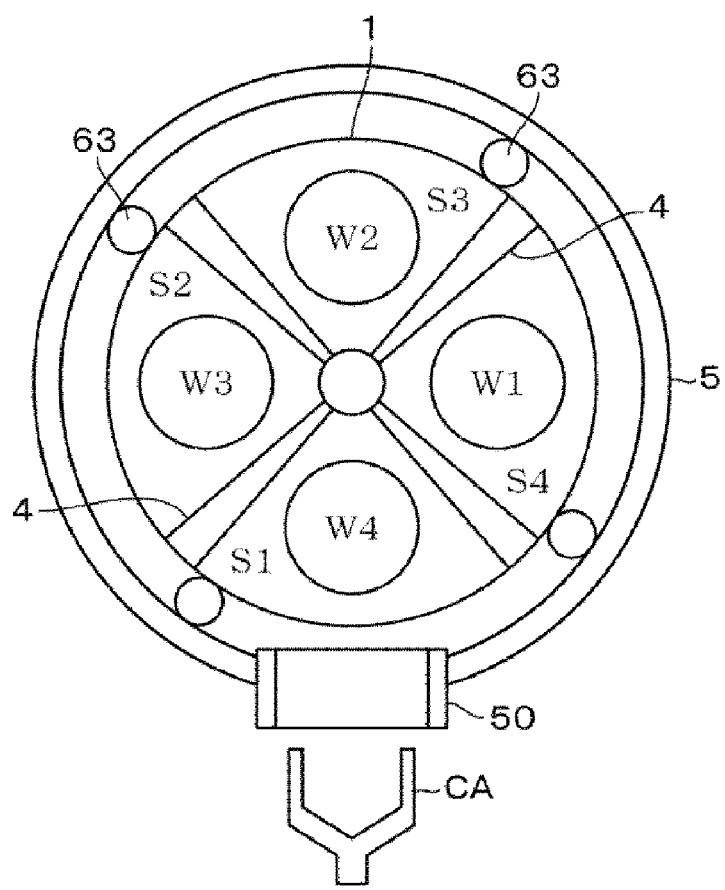
FIG. 6 is an explanatory view showing an operation of the film forming apparatus.

On a ceiling portion of the processing container, four isolation parts 4 are installed so as to extend in the radial direction of the rotary table 1 so that the upper region of the rotary table 1 is equally divided into four processing regions in the circumferential direction. The rotary table 1 is intermittently rotated and controlled so that the four mounting tables 2 are respectively stationed at the four processing regions respectively. Therefore, when wafers are placed on their respective mounting tables 2 and viewed in a plan view, a state shown in FIG. 6 is obtained as will be described later.

A so-called ALD is a process of sequentially supplying a precursor gas (adsorption gas) of a thin film and a reaction gas reacting with the precursor gas onto the surface of a wafer to laminate reaction products and a method of repeating a cycle a number of times, the cycle including supplying the precursor gas and the reaction gas in order. In the present embodiment, for example, a region for supplying a precursor gas, a region for supplying a reaction gas, a region for supplying a precursor gas, and a region for supplying a reaction gas are allocated to four processing regions respectively in a clockwise direction. Therefore, by intermittently rotating the rotary table 1 so as to be stopped in a state where the wafers are positioned in their respective processing regions, it is possible to perform two cycles while rotating the rotary table 1 once.

Further, in a stop position at which the rotary table 1 is stopped in order to carry out a film forming process on a wafer, the wafer is rotated on its own axis since the rotation axis 21 is rotated due to the rotation of the driving gear part 32, as described previously. That is, the film forming process is carried out while the wafer is being rotated on its own axis.

DETAILS OF EMBODIMENT OF THE PRESENT DISCLOSURE

First Embodiment

Figure 2:
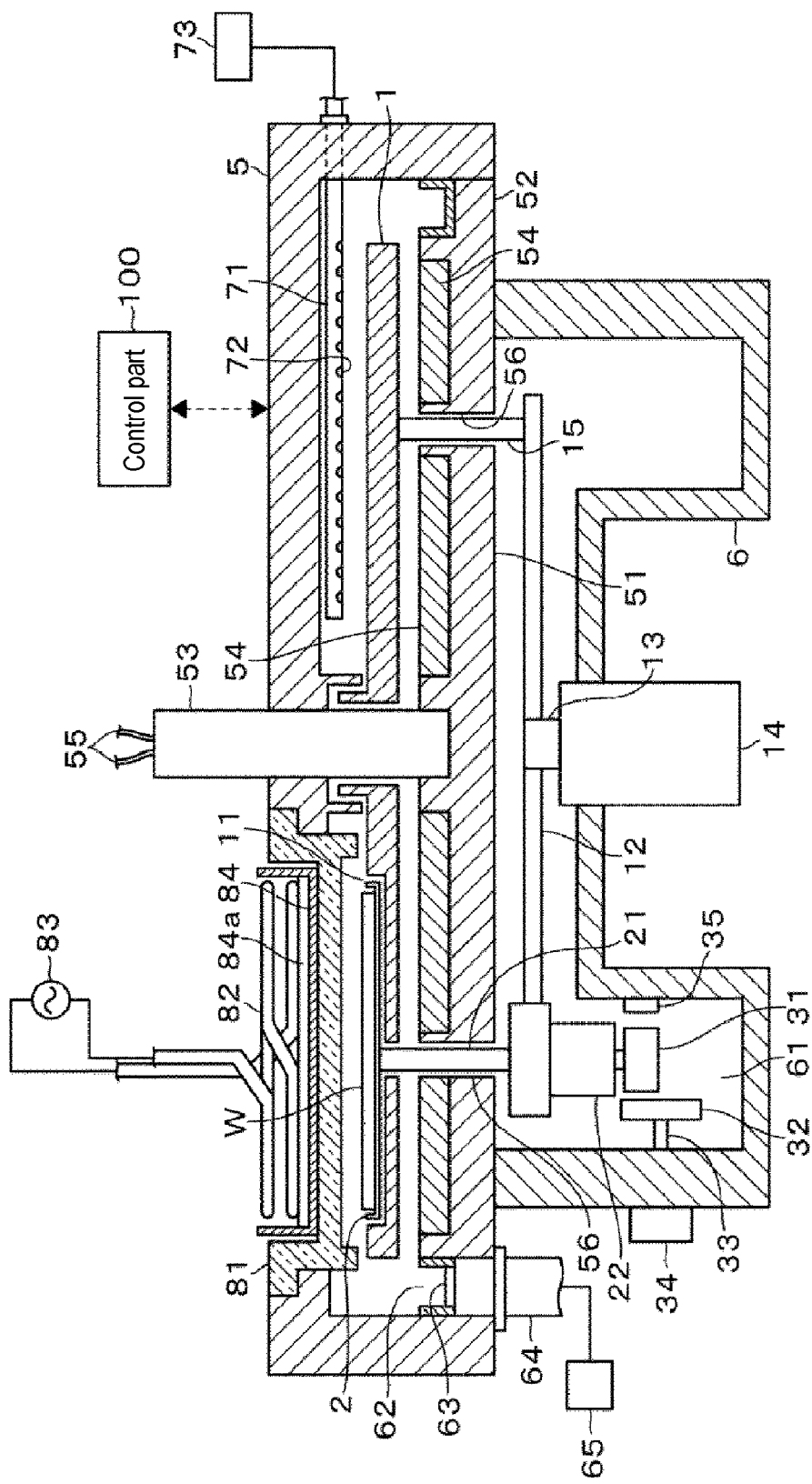
FIG. 2 is a longitudinal sectional view of the film forming apparatus according to the first embodiment of the present disclosure.

Next, the detailed structure and operation of the film forming apparatus used in the first embodiment of the present disclosure will be described. FIG. 2 is a longitudinal sectional view of the film forming apparatus in which the section of a portion corresponding to a region for supplying a precursor gas is positioned on the right side and the section of a portion corresponding to a region for supplying a reaction gas is positioned on the left side. The film forming apparatus includes a flat processing container 5 whose bottom portion is divided in the radial direction into a central portion 51 and an annular portion 52 surrounding the central portion 51. The central portion 51 is supported to a support pillar 53 installed at the center of the ceiling portion of the processing container 5 such that the support pillar 53 projects from above, and the annular portion 52 is fixed to the side wall of the processing container 5.

A heating part 54 for heating a wafer W as a substrate is disposed on the upper surfaces of the central portion 51 and the annular portion 52. For example, the heating part 54 is formed by installing a heating wire in a container made of quartz. A feeder line 55 of the heating part 54 in the central portion 51 passes through the inside of the support pillar 53 and is drawn out to the outside. Although not shown, a feeder line of the heating part 54 in the annular portion 52 passes through the inside of the processing container 5 and is drawn out to the outside.

The rotary support 12 described above is disposed on the lower side of the processing container 5 so as to be able to be horizontally rotated by a rotary shaft 13 installed at a position corresponding to the central portion of the processing container 5. The rotary shaft 13 is driven to be rotated by a drive part (not shown in the figure) which is housed in a case body 14. The rotary table 1 is installed inside the processing container 5 and is supported on the rotary support 12 via a plurality of rod-like support member 15. The support members 15 are disposed through annular gaps 56 between the central portion 51 and the annular portion 52 corresponding to the bottom portion of the processing container 5 along the circumferential direction. The right side portion of the rotary table 2 in FIG. 2 shows a region where the mounting table 2 is not installed and the left side portion shows a region where the mounting table 2 is installed.

As described above, the four circular recesses 11 are formed at equal intervals in the circumferential direction on the upper surface of the rotary table 1 and the mounting table 2 on which the wafer W is mounted is supported by the rotation axis 21 so as to be accommodated in each recess 11. The mounting table 2 is set to make the upper surface of the wafer W flush with the upper surface of the rotary table 1 when the wafer W is mounted. The recesses 11 located around the mounting table 2 are not shown FIGS. 3 and 4. Each rotation axis 21 passes through the annular gap 56 and is rotatably supported to the rotary support 12 by a bearing part 22. Accordingly, it may be said that the mounting table 2 is configured to be revolvable and rotatable on its axis. Each rotation axis 21 extends to the lower side of the bearing part 22, and the above-described driven gear part 31 is installed at the lower end portion of the bearing part 22. A cover body 6 for partitioning the rotary support 12 and the like from the air atmosphere is installed on the lower side of the bottom portion of the processing container 5. The cover body 6 is molded in a shape in which a portion near a periphery of a flat cylindrical body is recessed so as to form an annular recessed portion 61. Four driving gear parts 32 are installed at equal intervals on an inner wall surface of an outer peripheral side of the recessed portion 61 when viewed from top.

The driving gear part 32 is attached to a tip of a horizontal rotary shaft 33 passing through a side wall of the recessed portion 61 of the cover body 6. A drive part 34 for rotating and axially moving the rotary shaft 33 is installed on a proximal end of the rotary shaft 33. N poles and S poles are alternately magnetized on a side peripheral surface of the driven gear part 31 in the circumferential direction. Further, the N poles and the S poles are alternately magnetized on one surface side of the driving gear part 32 in the circumferential direction. The driven gear part 31 and the driving gear part 32 are positioned so that a passing region of the driven gear part 31 faces a portion closer to an upper side than a center of the one surface side of the driving gear part 32.

When the wafer W is positioned at a position corresponding to the stop position of the rotary table 1, in other words, in a circumferential central portion in each of the above-described four processing regions, the driving gear part 32 is disposed at a position where a magnetic gear is formed between the driving gear part 32 and the driven gear part 31. When the driven gear part 31 is stopped at a position facing the driving gear part 32, the driving gear part 32 approaches the driven gear part 31 and is moved forward (i.e., is moved to a radial center side of the processing container 5) by the rotary shaft 33 so as to form the magnetic gear. Then, when the driving gear part 32 is rotated in a counterclockwise direction, for example when viewed from the rotary shaft 33 side, the driven gear part 31 is rotated in the clockwise direction, whereby the mounting table 2 is rotated on its own axis. In addition, on a wall surface of an inner peripheral side of the recessed portion 61 of the cover body 6, a brake member 35 made of, e.g., a magnet body is installed at a position facing the driving gear part 32 with the passing region of the driven gear part 31 interposed therebetween. The brake member 35 plays a role of stopping the rotation of the driven gear part 31 after retracting the driving gear part 32 to be separated from the driven gear part 31 when the rotary table 1 is rotated.

Figure 3:
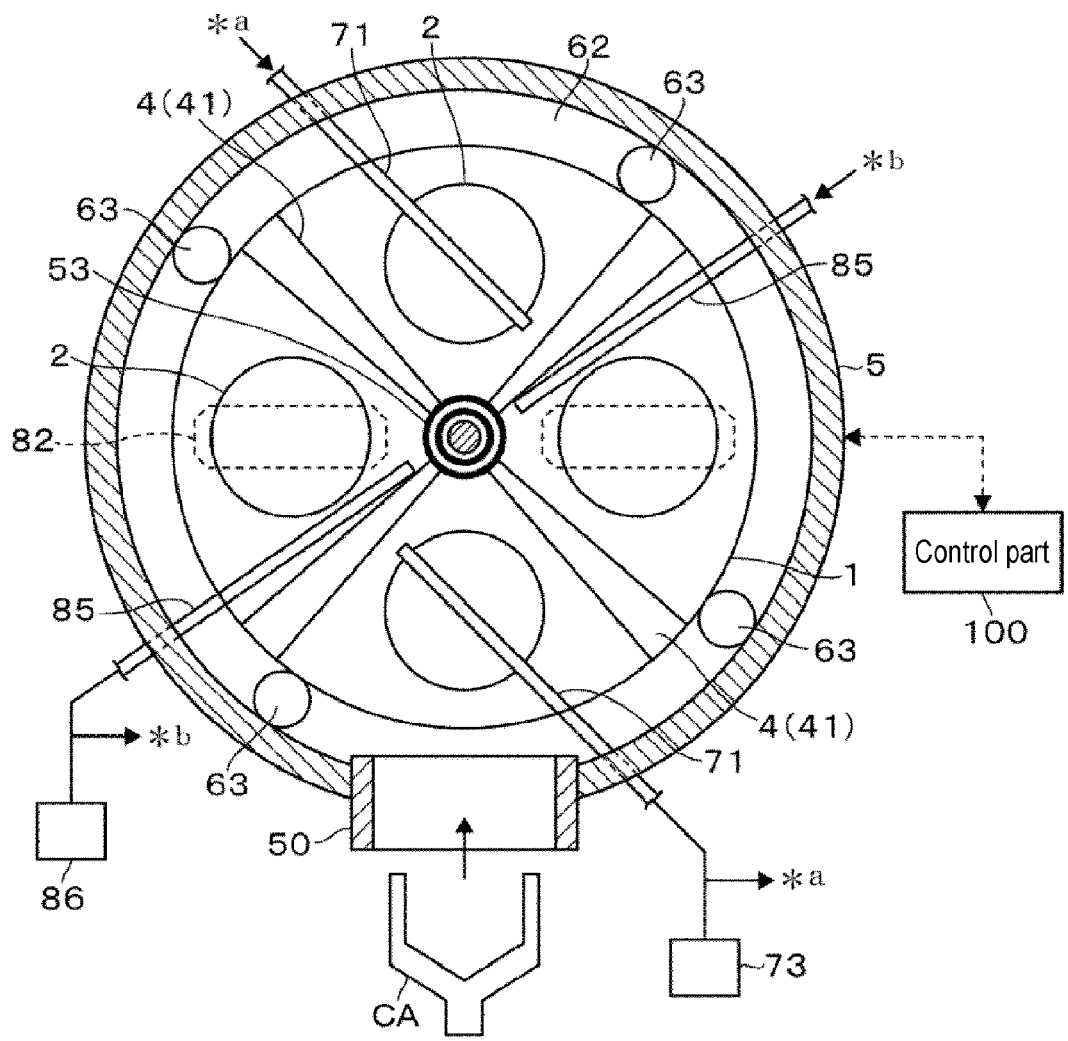
FIG. 3 is a cross-sectional view of the film forming apparatus according to the first embodiment of the present disclosure.

Among the four processing regions described above, a region for supplying a precursor gas and adsorbing it on the wafer W is referred to as a first processing region, and a region for supplying a reaction gas and making it react with the precursor gas on the wafer W is referred to as a second processing region. As described in the outline of the embodiment, the first processing region and the second processing region are alternately provided along the circumferential direction of the processing container 5. In the first processing region positioned in the right side of the center of the processing container 5 in FIG. 2, a precursor gas nozzle 71, which is a precursor gas supply part for supplying a precursor gas, is disposed at a position higher than an approach path of a transfer mechanism CA, which will be described later, in parallel with the rotary table 1 through the side wall of the processing container 5. As shown in FIG. 3, the precursor gas nozzle 71 extends along a line inclined in a lateral direction with respect to a line connecting a portion penetrating the side wall of the processing container 5 and the center of the rotary table 1. Further, the precursor gas nozzle 71 is formed with gas discharge holes 72 spaced at intervals in the longitudinal direction on the lower surface side, and an arrangement region of the gas discharge holes 72 is set to a length covering the diameter of the wafer W.

Figure 4:
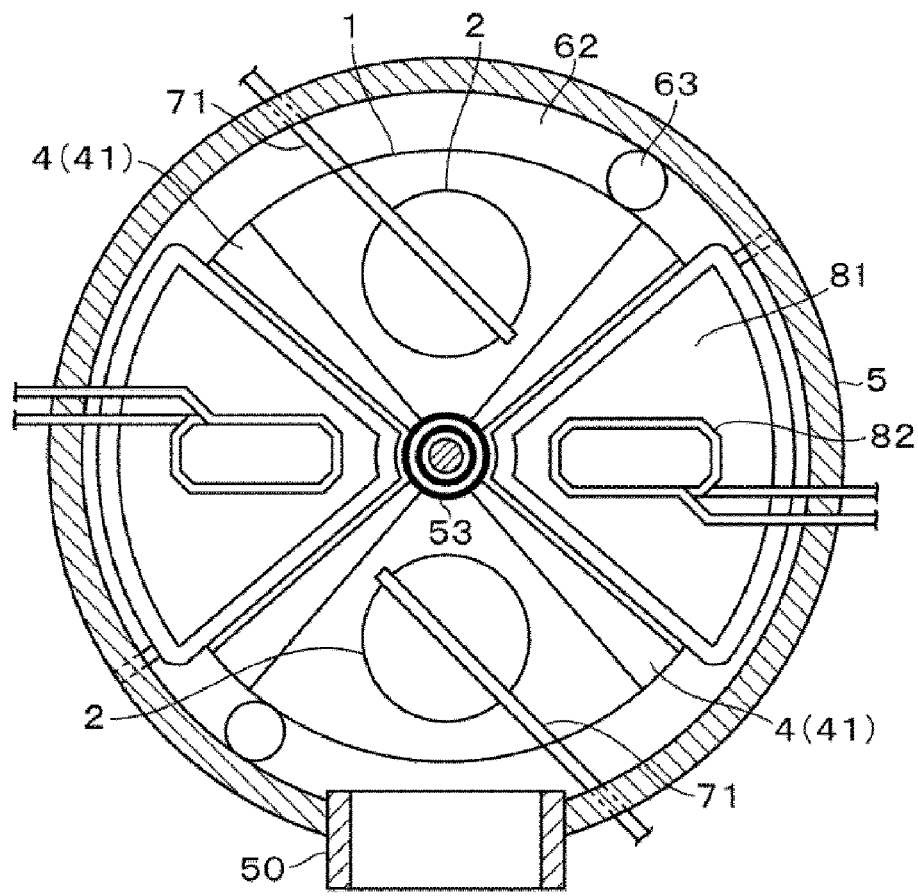
FIG. 4 is a cross-sectional view showing a plasma generating part in an overlapped manner in FIG. 3.

The proximal end side of the precursor gas nozzle 71 is connected to a precursor gas supply system 73 including a precursor gas supply source, a gas supply control device group, and the like. As one example, if a film forming process performed on the wafer W is for a silicon nitride film, a DCS (dichlorosilane) gas is used as the precursor gas. A plasma generating mechanism 8 is installed above the second processing region located on the left side of the center of the processing container 5 in FIG. 2 via a dielectric member 81 constituting a part of the ceiling portion of the processing container 5. The dielectric member 81 is mold in a shape to fit into an opening formed in the ceiling portion of the processing container 5. As shown in FIG. 4, the dielectric member 81 has a fan-like planar shape and a peripheral portion thereof is formed as a flange part which is erected and bent outward.

The plasma generating mechanism 8 includes an antenna 82 wound in a coil shape, and a high-frequency power supply 83 is connected to both ends of the antenna 82. In addition, between the antenna 82 and the dielectric member 81 is interposed a Faraday shield 84 which is a conductive plate having a slit formed therein for preventing an electric field component among the electric field component and a magnetic field component generated in the antenna 82 from going toward the wafer W. Reference numeral 84a denotes a dielectric plate. FIG. 3 shows a portion below the ceiling portion of the processing container 5, but, for the sake of convenience, a position of the antenna 82 in the second processing area is indicated by a dotted line.

In the second processing region, as shown in FIG. 3, a reaction gas nozzle 85 as a reaction gas supply part is disposed in parallel to the rotary table 1 through the side wall of the processing container 5 in the upstream side of the dielectric member 81 in the rotation direction of the rotary table 1. The reaction gas nozzle 85 extends in the radial direction of the rotary table 1 and has gas ejection holes formed on the lower surface side thereof at intervals in the length direction. When viewed along the radial direction of the rotary table 1, an arrangement region of the gas discharge holes is set so that the reaction gas is supplied to the entire passing region of the wafer W. A proximal end side of the reaction gas nozzle 85 is connected to a reaction gas supply system 86 including a reaction gas supply source, a gas supply control device group, and the like. For example, if the film forming process is for a silicon nitride film, an ammonia gas is used as the reaction gas. In addition to the reaction gas from the reaction gas nozzle 85, a rare gas such as an argon gas for plasma ignition may be supplied.

A groove portion 62 for exhaust is formed at a peripheral portion of the bottom of the processing container 5 so as to surround the rotary table 1. An exhaust port 63 is formed in the groove portion 62 at a position corresponding to a downstream end portion of each processing region when viewed in the rotation direction of the rotary table 1. One end side of an exhaust pipe 64 (see FIG. 2) is connected to each exhaust port 63, and a vacuum pump, which is a vacuum exhaust mechanism 65, is connected to the other end side of the exhaust pipe 64. In addition, as shown in FIG. 3, a loading/unloading port 50 for the wafer W which is opened/closed by a gate valve (not shown) is formed in the side wall of the processing container 5 facing one of the two first processing regions. The wafer W is delivered to and from each mounting table 2 by an external transfer mechanism CA via the loading/unloading port 50.

The delivery of the wafer W is performed by raising lift pins (not shown) from the lower side of the mounting table 2 in a state where the rotary table 1 is kept stationary, picking up and receiving the wafer W on the transfer mechanism CA, and lowering the lift pins after moving the transfer mechanism CA backward. For this reason, for example, three passing holes for the lift pins are formed in each mounting table 2 in the circumferential direction, and at the same time, through-holes are formed in the bottom of the processing container 5 in the processing region facing the rotary table 1 and the loading/unloading port 50 of the wafer W corresponding to an arrangement of the passing holes. As a result, the lift pins can be raised and lowered through the through-hole and the passing holes. For example, a lift mechanism of the lift pins is installed in the cover body 6.

Figure 5:
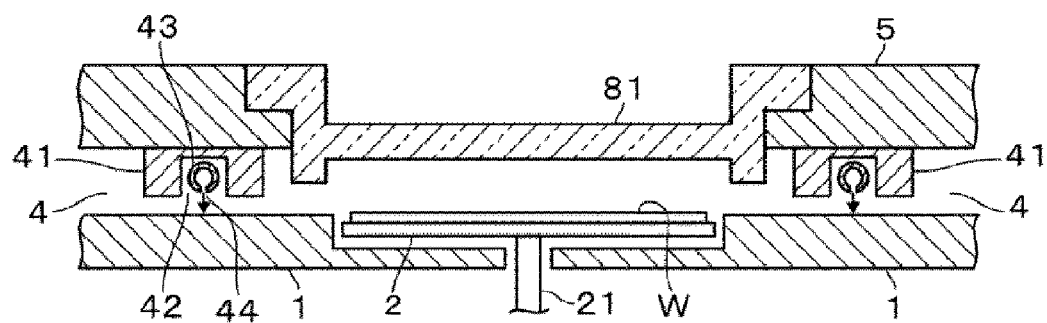
FIG. 5 is a longitudinal sectional view taken along a portion in the radial direction of a rotary table used in the film forming apparatus.

Here, the isolation parts 4 will be described. As shown in FIG. 5, each of the isolation parts 4 includes an isolation plate 41 having a fan-like planar shape formed in such a manner that a dimension in a width direction gradually increases from the center side toward an outer peripheral side of the processing container 5. The isolation plate 41 has an outer end portion which is downward bent in a key shape and extends downward from the outer periphery of the rotary table 1 to ensure a function of isolating gases between the processing regions. In addition, the isolation plate 41 has an inner end portion fixed to the support pillar 53. Further, the isolation plate 41 has an upper surface fixed to the ceiling portion of the processing container 5, and a lower surface spaced apart from each other in the width direction, thereby forming a projection. In other words, the lower surface of the separation plate 41 has a groove portion 42 formed in a central portion of the lower surface in the width direction.

In this groove portion 42 is disposed an isolation gas nozzle 43 so as to extend in parallel to the rotary table 1 and in the radial direction through the side wall of the processing container 5. The isolation gas nozzle 43 has gas discharge holes 44 formed in a lower surface side thereof at intervals in a longitudinal direction of the isolation gas nozzle 43. When viewed along the radial direction of the rotary table 1, an arrangement region of the gas discharge holes 44 is set so that an isolation gas is supplied to the entire passing region of the wafer W. Although not shown, a proximal end portion of the isolation gas nozzle 43 is connected to an isolation gas supply system including an isolation gas supply source, a gas supply control device group, and the like. For example, a nitrogen gas which is an inert gas is used as the isolation gas.

As shown in FIG. 2, the film forming apparatus includes a control part 100 which include a program for controlling an operation of the film forming apparatus, which will be described later. This program is meant to include a process recipe in which process procedures and process parameters are written. The program is stored in a storage medium such as a hard disk, a compact disk, an optical disk, a USB memory, a memory card, etc., and is downloaded to the control part 100.

Next, a film forming process using the above-described film forming apparatus will be described by taking as an example a process of forming a silicon nitride film on wafers W. Four wafers W are sequentially transferred onto the mounting table 2 by a transfer mechanism CA in a vacuum transfer chamber adjacent to the processing container 5 via the loading/unloading port 50, as shown in FIG. 6. As described above, the delivery of each wafer W is performed via lift pins (not shown). Specifically, after one wafer W is transferred onto a mounting table 2, the rotary table 1 is rotated, for example, in the clockwise direction to deliver the subsequent wafer W to a next adjacent mounting table 2. In the following description, symbols W1 to W4 are assigned to the respective wafers W in order from the wafer W first transferred onto a mounting table 2. Where individual descriptions are made for the four wafers, the assigned symbols are used and "W" is used for comprehensive explanation.

Figure 7:
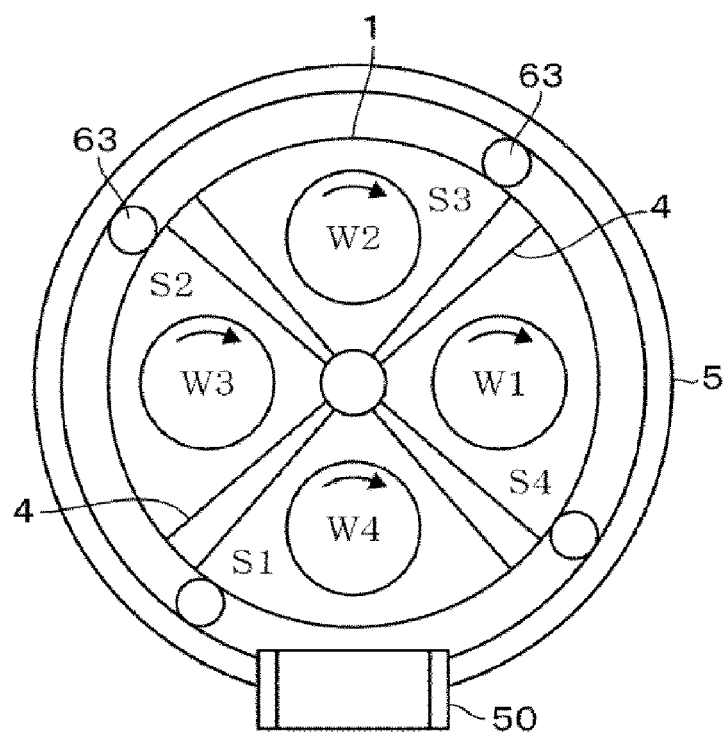
FIG. 7 is an explanatory view showing an operation of the film forming apparatus.

For the sake of convenience of explanation, assuming that the symbols are assigned as a processing region S1, a processing region S2, a processing region S3 and a processing region S4 sequentially in the clockwise direction from a region facing the loading/unloading port 50, the processing regions S1 and S3 are a first processing region (a region to which a precursor gas is supplied), and the processing regions S2 and S4 are a second processing region (a region to which a reaction gas is supplied). Returning to FIG. 6, after the wafers W1 to W4 are mounted on each mounting table 2, the loading/unloading port 50 is closed by a gate valve (not shown), the interior of the processing container 5 is adjusted to a predetermined process pressure, for example, 100 Pa, and each mounting table 2 is rotated on its axis (i.e., the wafers W1 to W4 are rotated on their axes) as shown in FIG. 7. By this time, the interior of the processing container 5 is heated to a predetermined temperature, for example, 400 degrees C. by the heating part 54.

In the first processing regions S1 and S3, a DCS gas as a precursor gas is discharged from the precursor gas nozzle 71 (see FIGS. 2 to 4) at a flow rate of, e.g., 900 sccm. In the second processing regions S2 and S4, a mixture of an ammonia gas as a reaction gas and a gas for plasma ignition such as an argon gas is discharged from the reaction gas nozzle 85 (see FIGS. 2 and 3). For example, the flow rate of the ammonia gas is 300 sccm and the flow rate of the argon gas is 2000 sccm. Further, in the second processing regions S2 and S4, the argon gas and the ammonia gas are plasmarized by supplying high frequency power to the antenna 82.

Further, in the isolation part 4, a nitrogen gas as an isolation gas is discharged from the isolation gas nozzle 43 shown in FIG. 5 at a predetermined flow rate, thereby preventing gases in mutually adjacent processing regions from being mixed with each other. In other words, the atmospheres of the processing regions are isolated from each other. Furthermore, since the exhaust port 63 is provided for each processing region at the downstream end of the processing region when viewed in the rotation direction of the rotary table 1, a gas supplied to each processing region flows to the downstream side in the processing region and is discharged together with the isolation gas flowing out of the isolation part 4.

The DCS gas is adsorbed on the surfaces of the wafers W4 and W2 located respectively in the first processing regions S1 and S3. At this time, since each of the wafers W1 to W4 is rotated by the above-described magnetic gear mechanism, the DCS gas is adsorbed onto the wafers W4 and W2 with good uniformity in the circumferential direction. Active species generated by ammonia plasmarization are supplied onto the surfaces of the wafers W3 and W1 located respectively in the second processing regions S2 and S4. At this point, however, since no adsorption of the DCS gas is yet performed, no reaction product is produced. The supply of gas and the generation of plasma in the second processing regions S2 and S4 may be performed after the next rotation (intermittent rotation) of the rotary table 1, that is, after the wafers W4 and W2 on which the DCS gas has been already adsorbed have located in the processing regions S2 and S4.

Figure 8:
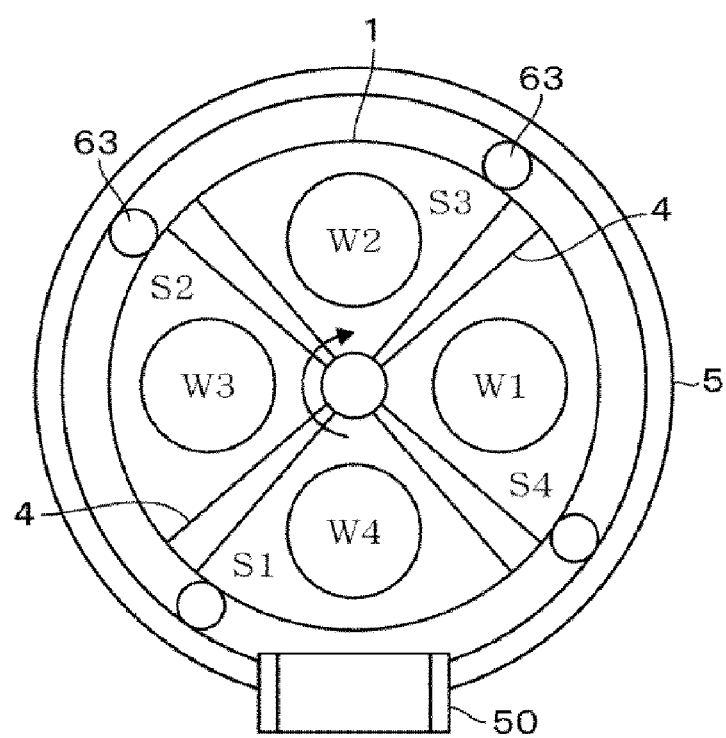
FIG. 8 is an explanatory view showing an operation of the film forming apparatus.
Figure 9:
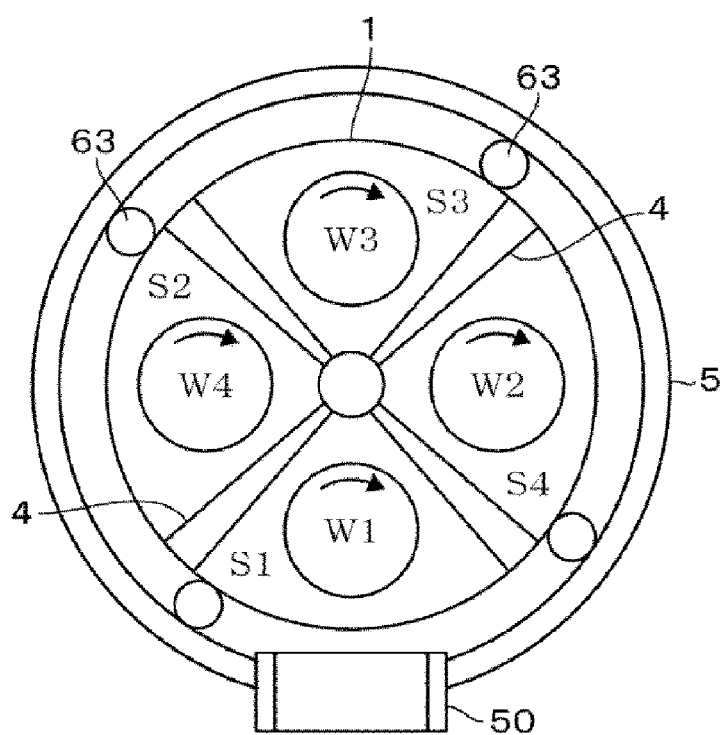
FIG. 9 is an explanatory view showing an operation of the film forming apparatus.

After the discharging of the DCS gas from the precursor gas nozzle 71 (see FIG. 3) is performed for, e.g., 10 seconds in the first processing regions S1 and S3, the rotary table 1 is rotated by 90 degrees in the clockwise direction (see FIG. 8) so as to move (revolve) each wafer W1 to W4 to a processing region adjacent to the processing region that has been located so far (more specifically, adjacent to the processing region in the clockwise direction when viewed in the rotation direction of the rotary table 1). The arrangement of the wafers W1 to W4 shown in FIG. 9 is a state after the rotation of the rotary table 1, in which the wafers W1, W4, W3 and W2 are located in the processing regions S1 to S4, respectively.

Then, the wafers W1, W4, W3 and W2 are processed in the respective processing regions S1 to S4 while being rotated on their own axes. Since the DCS gas as a precursor gas has already been adsorbed on the wafers W4 and W2, in the second processing regions S2 and S4, the active species of the ammonia gas as a reaction gas react with the DCS gas on the wafers W4 and W2 to form a silicon nitride layer which is a reaction product. In the first processing regions S1 and S3, the DCS gas is discharged from the precursor gas nozzle 71 and is adsorbed onto the wafers W1 and W3 respectively located in the first processing regions S1 and S3.

In the second processing regions S2 and S4, the time required to supply the active species of the ammonia gas onto the wafer W and make them react with DCS to generate a reaction product is, for example, 20 seconds. The time required means a time required to make a sufficient reaction of the active species with DCS (i.e., sufficiently nitride the surface of the wafer W) to obtain film quality meeting the specifications. On the other hand, the time required to adsorb the DCS gas on the surface of the wafer W is, for example, 10 seconds, which is shorter than the time required for the reaction by the active species of the ammonia gas. Therefore, after the wafers W1 and W3 are respectively located in the first processing regions S1 and S3 and the DCS gas is discharged from the precursor gas nozzle 71 for the time required, the discharge of the DCS gas is stopped and the wafers W1 and W3 wait in the first processing regions S1 and S3 until the processing in the second processing regions S2 and S4 is completed.

Figure 10:
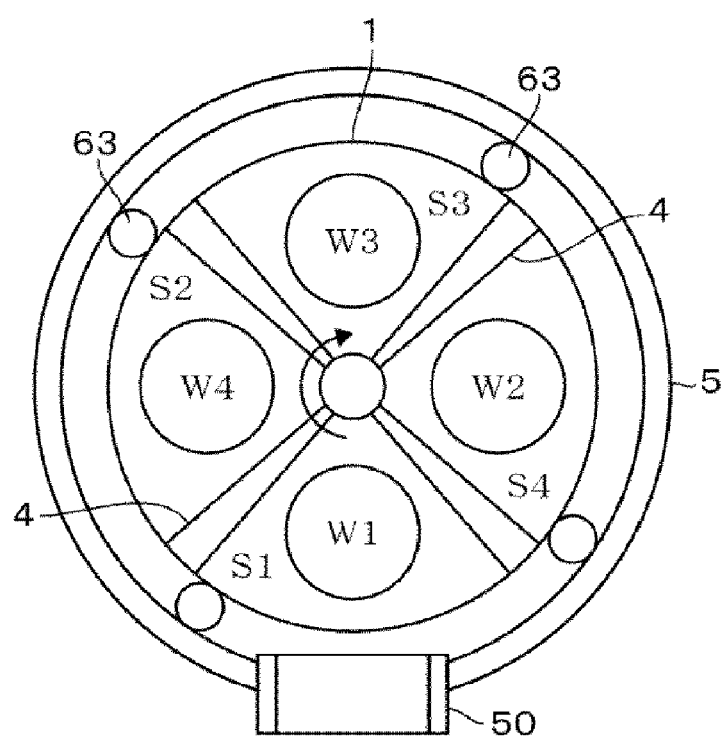
FIG. 10 is an explanatory view showing an operation of the film forming apparatus.
Figure 11:
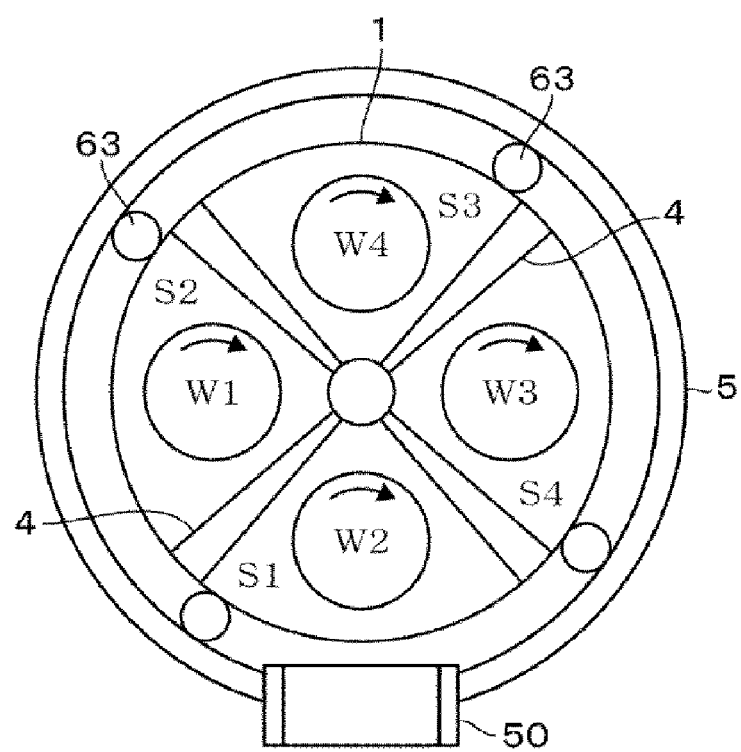
FIG. 11 is an explanatory view showing an operation of the film forming apparatus.

On the other hand, since the reaction in the second processing regions S2 and S4 is rate-limited for the progress of the process, for example, the supply of ammonia gas and the generation of plasma continue until a series of film forming processes is completed for the four wafers W1 to W4. When the wafers W4 and W2 are respectively processed in the second processing regions S2 and S4, that is, when a preset time set in accordance with the time required for the reaction has elapsed, the rotary table 1 is rotated by 90 degrees in the clockwise direction so as to move the wafers W4, W3, W2 and W1 to the processing regions S3, S4, S1 and S2 on the downstream side, respectively, as shown in FIG. 10. FIG. 11 shows a state after the movement. Similarly, while the wafers W4, W3, W2 and W1 are being rotated on their axes, the DCS gas is adsorbed on the wafers W2 and W4 respectively located in the first processing regions S1 and S3 and the reaction process by the active species of ammonia gas is performed on the wafers W1 and W3 respectively located the second processing regions S2 and S4.

Figure 12:
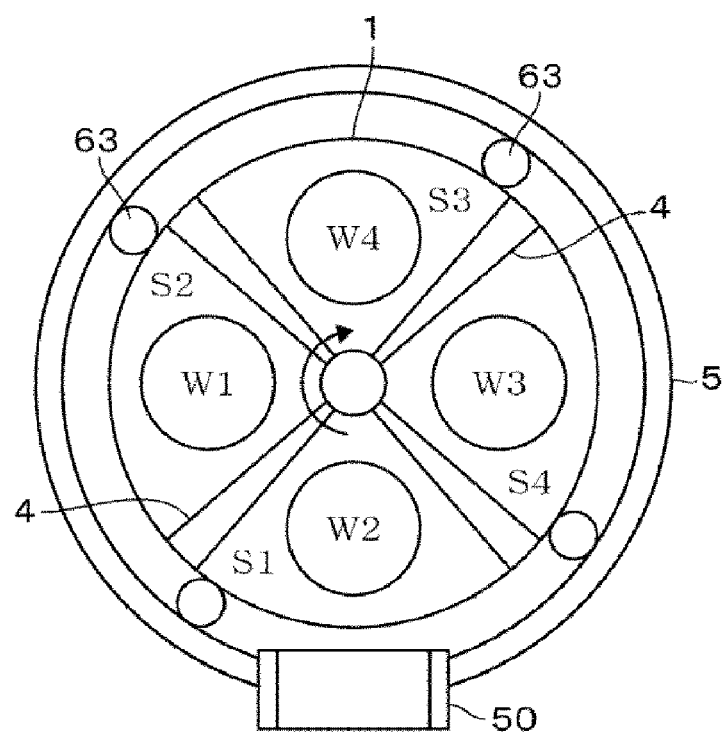
FIG. 12 is an explanatory view showing an operation of the film forming apparatus.
Figure 13:
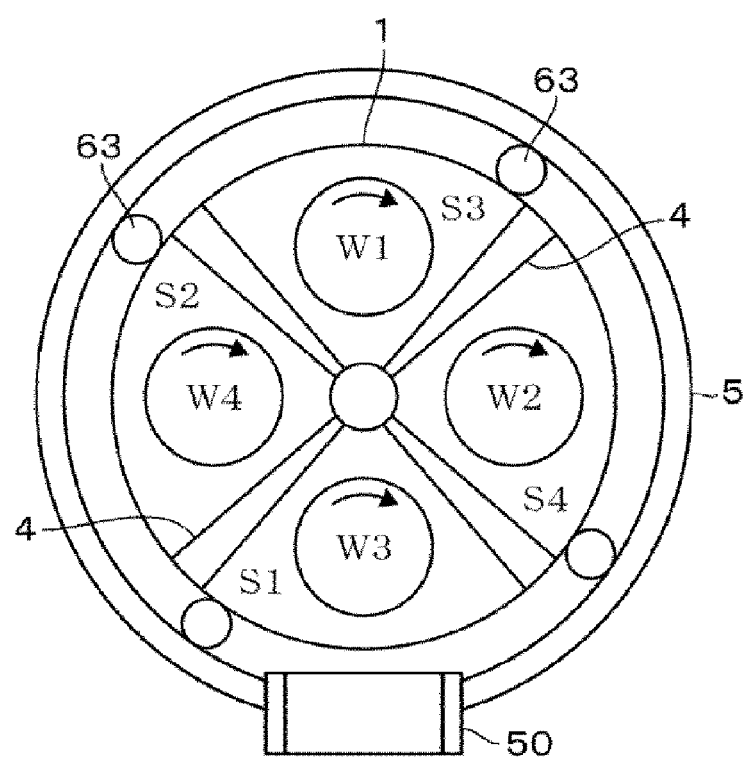
FIG. 13 is an explanatory view showing an operation of the film forming apparatus.
Figure 14:
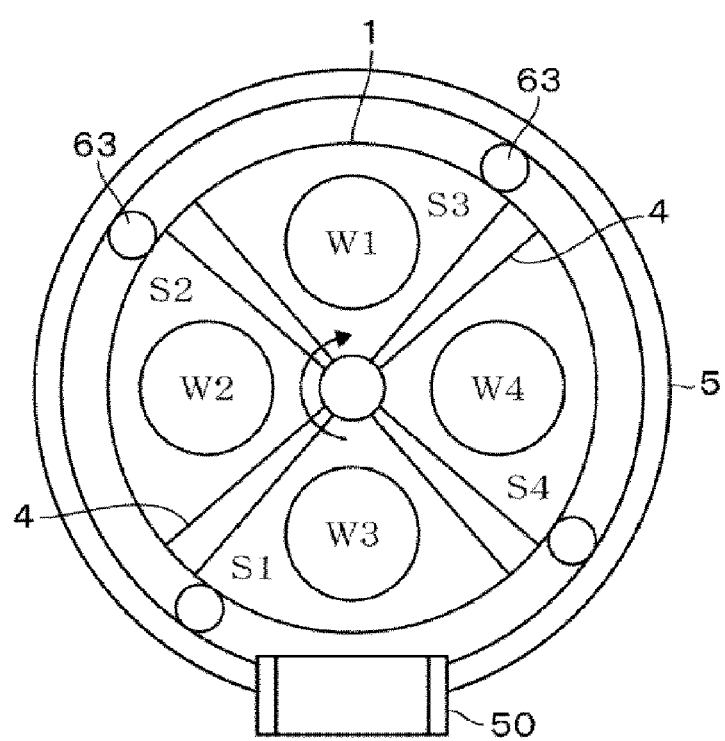
FIG. 14 is an explanatory view showing an operation of the film forming apparatus.

Thereafter, as shown in FIGS. 12 and 13, the rotary table 1 is rotated by 90 degrees in the clockwise direction. While the wafers W4 and W2 are being rotated on their axes, the active species of ammonia are supplied onto the wafers W4 and W2 respectively located in the second processing regions S4 and S2 and react with the DCS gas already adsorbed in the first processing regions S3 and S1 to laminate a silicon nitride layer. For the wafers W1 and W3 respectively located in the first processing regions S1 and S3, the DCS gas is adsorbed on the already-formed silicon nitride layer. When the set time elapses, the rotary table 1 is rotated to return to the state of FIG. 6, as shown in FIG. 14.

Thereafter, in the same manner, the rotary table 1 is sequentially stopped by the set time, and its operation of being intermittently rotated clockwise by 90 degrees is repeated a set number of times. Assuming that the last stop position of the rotary table 1 is the state shown in FIG. 6, while the process is being performed in the second process regions S2 and S4, in order to eliminate wasteful consumption of the precursor gas, the precursor gas is not discharged in the first processing regions S1 and S3. When a series of film forming processes is completed thus to form a silicon nitride film by ALD on each wafer W, each wafer W is unloaded from the processing container 5 by the transfer mechanism CA in the procedure reverse to the aforementioned procedure of loading the wafers W.

According to the above-described embodiment, the interior of the processing container 5 is partitioned into the two first processing regions and the two second processing regions which are alternately isolated from each other at equal intervals along the circumferential direction of the rotary table 1 with the isolation parts interposed therebetween. Then, the mounting table 2 is disposed so that one wafer W is positioned in each processing region, and the rotary table 1 is intermittently rotated to alternately place the wafers W in the first processing regions and the second processing regions to form the silicon nitride film by ALD. Therefore, the cycle of adsorption of the DCS gas as the precursor gas and the reaction by the active species of the ammonia gas as the reaction gas can be performed twice while the rotary table 1 is being rotated once, thereby achieving high productivity.

Further, in each of the first processing regions and the second processing regions, since the process is performed while the wafers W are being rotated on their axes, it is possible to achieve good uniformity of film thickness and film quality in the circumferential direction of the wafers W. Furthermore, since the rotary table 1 is intermittently rotated in accordance with the time required for the reaction by the active species of ammonia gas, which is longer than the time required for the adsorption of the DCS gas, sufficient nitriding can be performed to obtain a film with high quality. After the DCS gas is discharged for a time required, the discharge of the DCS gas is stopped while waiting until the process with the ammonia gas is completed, which contributes to the reduction of the consumption of the DCS gas.

Modification of the First Embodiment

Figure 15:
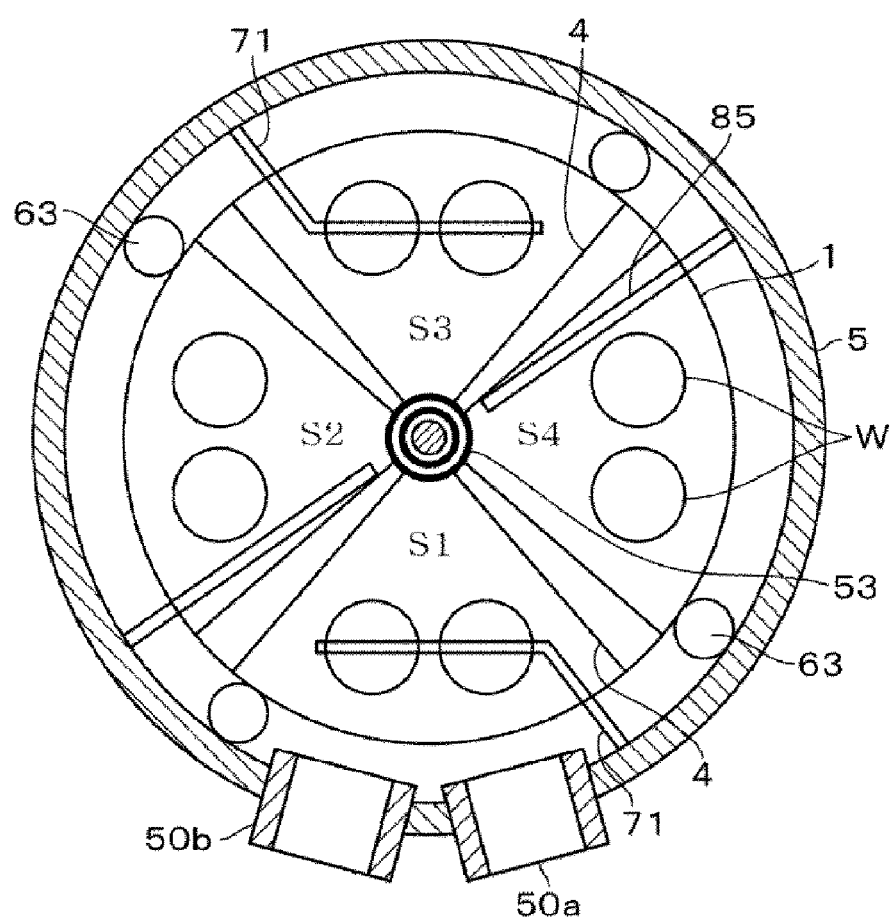
FIG. 15 is a plane view showing a modification of the first embodiment of the present disclosure.

In the above-described embodiment, one wafer W is located in each of the four processing regions, but, as shown in FIG. 15, eight mounting tables 2 may be installed and two wafers W may be located in each of the four processing regions. In FIG. 15, reference numerals 50a and 50b denote loading ports. Furthermore, the number of wafers W placed in each processing region when the rotary table 1 is stopped may be three or four or more. The number of first processing regions and the number of second processing regions are not limited to two but may be three or more.

In the above-described embodiment, the ammonia gas is plasmarized, but the ammonia gas may be supplied onto the wafers W without being plasmarized. In the above-described embodiment, after the DCS gas is discharged for the set time, the discharge is stopped until the reaction by the ammonia gas is completed. However, after a predetermined time has passed after the wafers W are located in the first processing regions, even when the DCS gas is discharged only for a time required and the adsorption of DCS gas and the reaction by ammonia gas are terminated at the same timing, it is possible to suppress consumption of the precursor gas. Even if the DCS gas is kept flowing until the series of film forming processes on the wafers W is completed, it is within the scope of the present disclosure.

The film forming process is not limited to forming the silicon nitride film. For example, the film forming process may be a process of forming a silicon oxide film, for example by using a bistertialbutylaminosilane gas as a silicon precursor gas and an oxygen gas or an ozone gas as a reaction gas. Alternatively, it may be a process of forming a titanium nitride film by using a titanium tetrachloride gas as a precursor gas and an ammonia gas as a reaction gas.

One of the driven gear part 31 and the driving gear part 32 constituting a rotation mechanism may be made of a non-magnetized magnetic material. Further, the driven gear part 31 may be configured to be horizontally rotated and the driving gear part 32 may be disposed below the driven gear part 31 so as to face the driven gear part 31. Furthermore, the rotation mechanism is not limited to the one which utilizes magnetism, but may have a configuration in which a driven gear part and a driving gear part are provided as mechanical gears and the driving gear part moves forward and backward with respect to a moving path of the driven gear part. Alternatively, the rotation mechanism may have a configuration in which a rotation mechanism is provided for each rotation axis 21.

Second Embodiment

Figure 16:
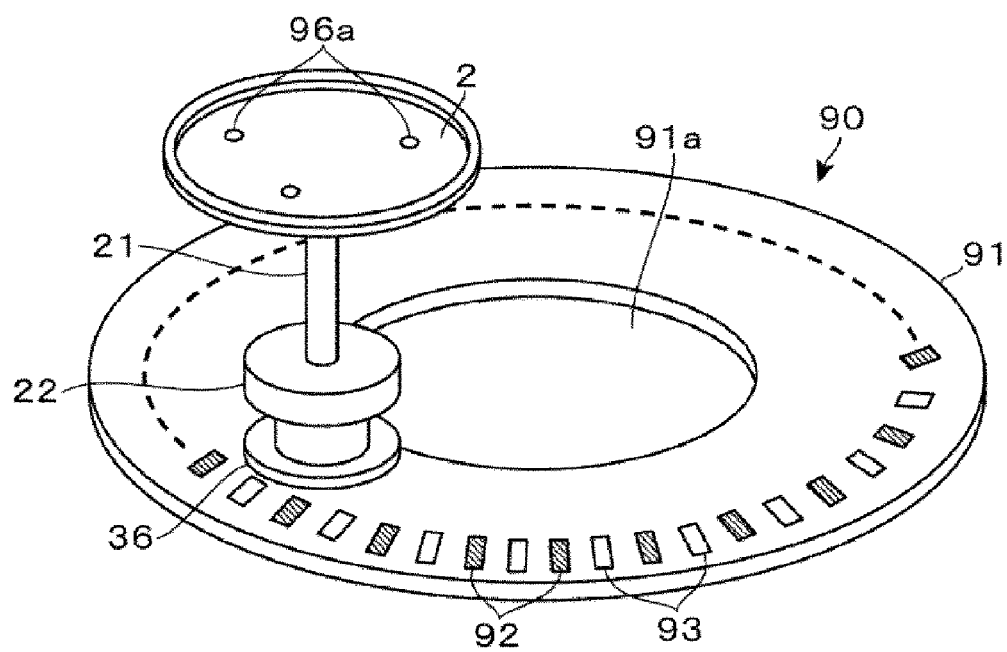
FIG. 16 is a perspective view schematically showing a rotation mechanism used in a second embodiment of the present disclosure.
Figure 17:
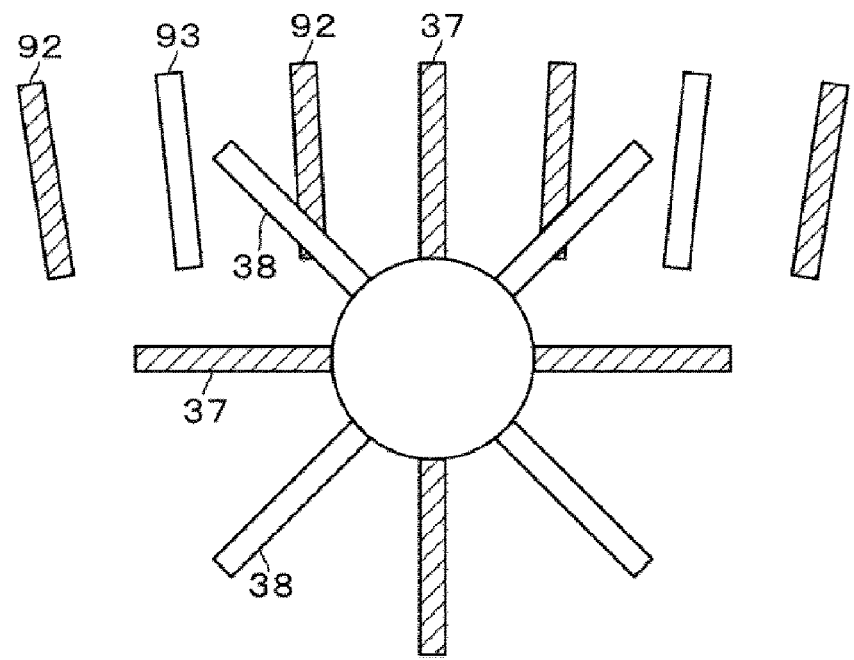
FIG. 17 is an explanatory view showing an arrangement of magnetic poles of the rotation mechanism.

A film forming apparatus using another example of the rotation mechanism for rotating the mounting table 2 will be described as a second embodiment of the present disclosure with reference to FIGS. 16 to 18. In the first embodiment, the driving gear part 32 is disposed at four positions along the circumferential direction of the rotary table 1. In the second embodiment, however, the driving gear part is disposed around the entire circumference along a revolution orbit of the rotary table 1. That is, the driving gear part 90 is installed so as to face a revolution orbit of the driven gear part 36 and has an annular plate-like body 91 having a circular opening 91a in the central portion thereof, with a center of the opening 91a aligned with a rotation center of the rotary table 1. On the upper surface of the driving gear part 90 are alternately disposed an N pole portion (indicated by hatching) 92 and an S pole portion 93, which are magnetic pole portions made of a permanent magnet, around the entire circumference along the revolution orbit of the driven gear part 36.

On the lower surface of the driven gear part 36 are alternately disposed rectangular N pole portions 37 (indicated by hatching) and rectangular S pole portions 38, which are magnetic pole portions made of a permanent magnet, along a circumferential direction of the driven gear part 36 in the rotation direction. The N pole portion 92 and the S pole portion 93 of the driving gear part 90 are arranged on a surface facing the lower surface of the driven gear part 36. FIG. 17 shows a correspondence between the magnetic pole portions of one driven gear part 36 and the magnetic pole portions of the driving gear part 90 below the driven gear part 36.

Figure 18:
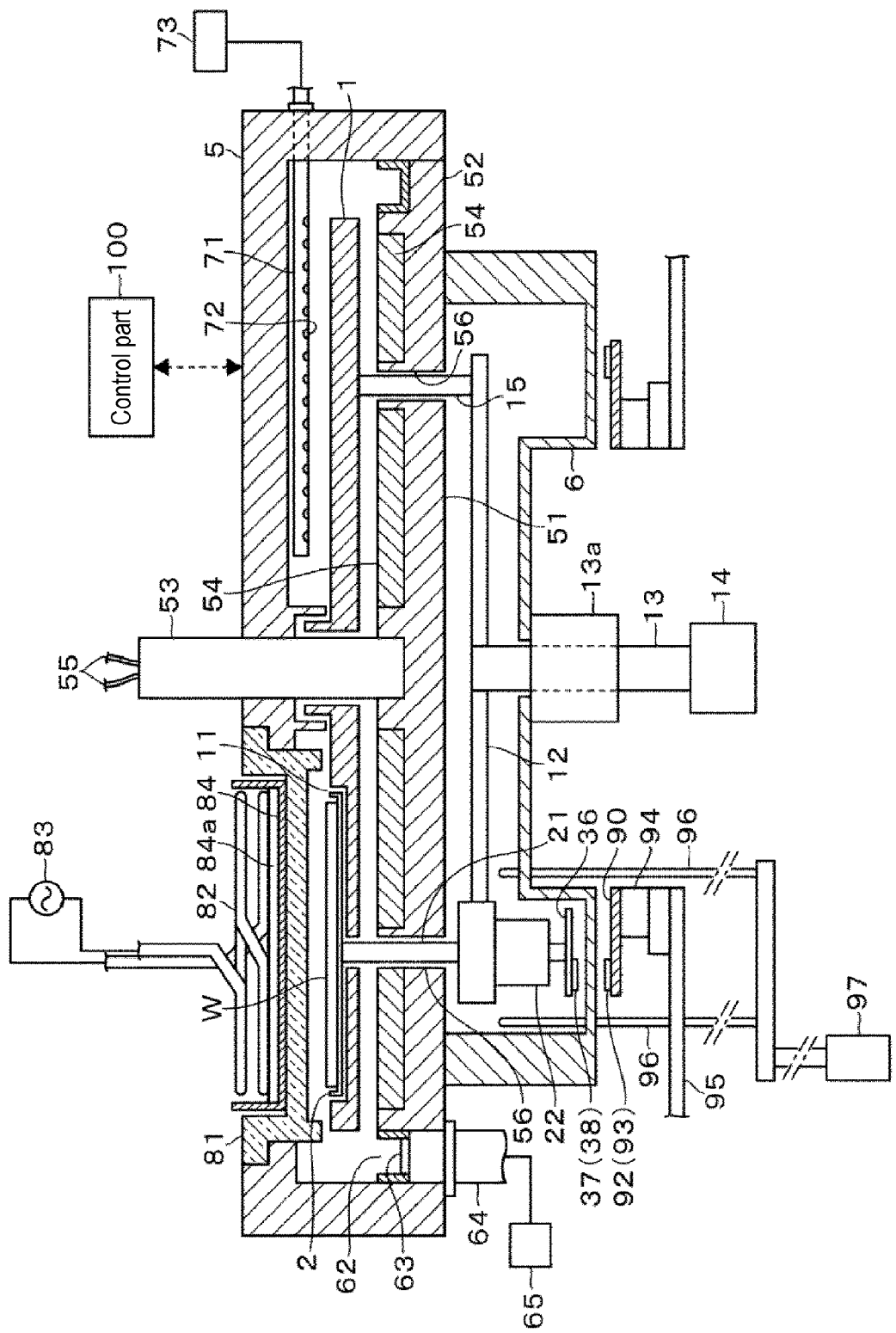
FIG. 18 is a longitudinal sectional view of a film forming apparatus according to the second embodiment of the present disclosure.

As shown in FIG. 18, the driven gear part 36 is disposed in an inner side (the vacuum atmosphere side) of the cover body 6, and the driving gear part 90 is disposed in an outer side (air atmosphere side) of the cover body 6. That is, a space between the driven gear part 36 and the driving gear part 90 is partitioned by the cover body 6 made of, e.g., aluminum or SUS which is a material through which a magnetic field lines passes. The driving gear part 90 is configured to be rotated by an annular direct drive motor (DD motor) 94 on a holding base 95, which is installed so as to surround the rotary shaft 13 of the rotary support 12. In FIG. 18, reference numeral 13a denotes a bearing part.

In such a rotation mechanism, the driven gear part 36 is stopped at a position determined by combined action of an attractive force and a repulsive force between the magnetic pole portions of the driven gear part 36 and the magnetic pole portions of the driving gear part 90. Accordingly, when a revolution speed (the number of revolutions (rpm) of the rotary table 1) of the driven gear part 36 is equal to the number of revolutions of the driving gear part 90, the driven gear part 36 is not rotated on its own axis. However, when a difference between the number of revolutions of the driven gear part 36 and the number of revolutions of the driving gear part 90 occurs, the driven gear part 36 is rotated on its own axis and its rotation speed is determined according to the difference in the number of revolutions. When the number of revolutions of the driving gear part 90 is larger than the number of revolutions of the rotary table 1, the driven gear part 36 is rotated in the clockwise direction as shown in FIG. 16.

Further, in the first embodiment, the lift pins used for loading and unloading the wafers W are not shown, but they are shown in FIG. 18. For example, three lift pins 96 are installed so as not to interfere with a moving path of the bearing part 22 by a lift mechanism 97, and tip portions of the lift pins 96 stand by in the cover body 6. When the wafer W is delivered to and from an external transfer mechanism CA, the lift pins 96 penetrate through a bottom plate portion of the processing container 5, the heating part 54, the rotary table 1 and holes formed in each mounting table 2, thereby holding the wafer W. Airtightness between the lift pins 96 and the cover body 6 is maintained, for example, by bellows. In FIG. 16, the holes (through-holes) formed in the mounting table 2 are denoted by reference numeral 96a.

Third Embodiment

In the above-described embodiments, the rotary table 1 is intermittently rotated so that the wafers W are alternately located in the first processing regions and the second processing regions, which may be called intermittent rotation mode. A third embodiment of the present disclosure prepares a continuous rotation mode of continuously rotating the rotary table 1 to perform a film forming process, in addition to the intermittent rotation mode, so that one of both modes can be selected.

Figure 19:
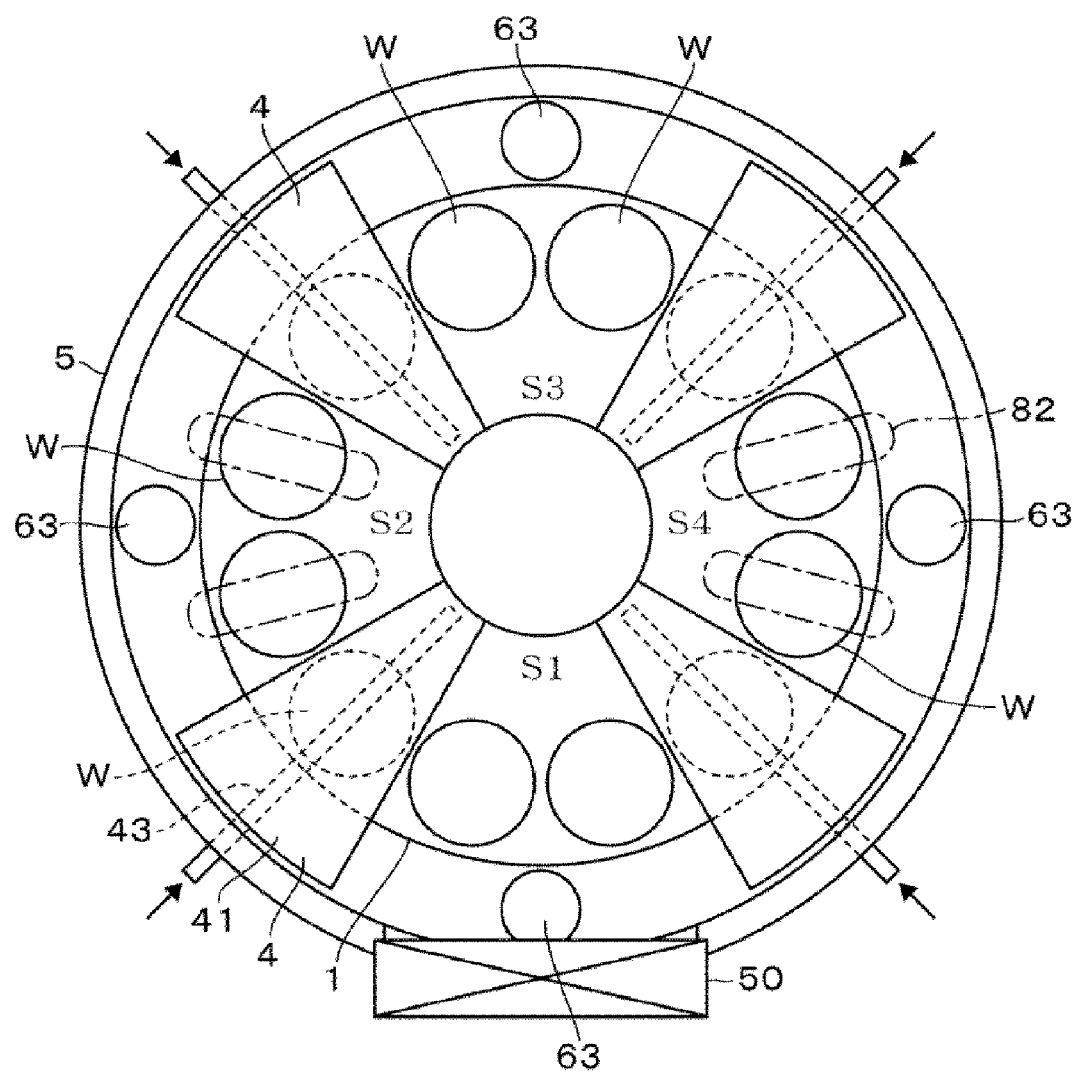
FIG. 19 is a plane view showing an arrangement of wafers when selecting a continuous rotation mode used in a third embodiment of the present disclosure.

FIG. 19 shows the arrangement of wafers W when the continuous rotation mode is selected. In the first embodiment, as shown in FIGS. 3 and 6, the mounting table 2 is disposed such that one wafer W is located in each of the first processing regions S1 and S3 and the second processing regions S2 and S4. Further, in the example of FIG. 15, the mounting table 2 is disposed such that two wafers W are positioned in each of the processing regions S1 to S4. In contrast, in the third embodiment, in a state in which one wafer W or two wafers W (see FIG. 19) are located in each of the processing regions S1 to S4, the mounting table 2 is disposed such that wafers W are further located between the processing regions S1 to S4, that is, in each of the four isolation parts 4. Therefore, when two wafers W are located in each of the processing regions S1 to S4, twelve mounting tables 2 are arranged.

FIG. 19 shows positions of the wafers W at the moment when the wafers W are being processed in the continuous rotation mode and when two wafers W are located in each of the processing regions 51 to S4. In the continuous rotation mode, the product wafers W, which are wafers to be processed, are mounted on all of the 12 mounting tables 2. In this example, the loading/unloading port 50 is configured so that the two wafers W can collectively pass through the loading/unloading port 50, and the two wafers W are horizontally held by an external transfer mechanism (not shown) so that the two wafers W can be simultaneously delivered to and from two adjacent mounting tables 2. The set of lift pins 96 described above is installed at a position corresponding to a stop position of the two mounting tables 2 and a wafer holding member at a tip portion of the transfer mechanism has a shape that does not interfere in plane with the lift pins 96. As a result, the wafers W are delivered between the transfer mechanism and the mounting tables 2 by cooperative action of the transfer mechanism and the lift pins 96.

In the continuous rotation mode, after the wafers W to be processed is mounted on all of the mounting tables 2 and the loading/unloading port 50 is closed, the rotary table 1 is rotated to rotate the mounting tables 2 on their own axes while rotating (revolving) the mounting tables 2 to establish process conditions. That is, as described in the first embodiment, the interior of the processing container 5 is set at a predetermined pressure, the wafers W are heated to a predetermined temperature, the DCS gas as the precursor gas is supplied in the first processing regions S1 and S3, and the aforementioned mixed gas is supplied and plasmarized in the second processing regions S2 and S4. Furthermore, an isolation gas is supplied in the isolation part 4.

The wafers W pass through the first processing region S1 (S3) and the second processing region S2 (S4) alternately and successively, and silicon nitride layers which are reaction products obtained by the adsorption of DCS gas and the reaction of the adsorbed DCS gas and the active species of ammonia gas are repeatedly formed and laminated. The continuous rotation mode is different from the intermittent rotation mode in that the wafers W to be processed are mounted on all of the 12 mounting tables 2, each of which is continuously rotated.

Figure 20:
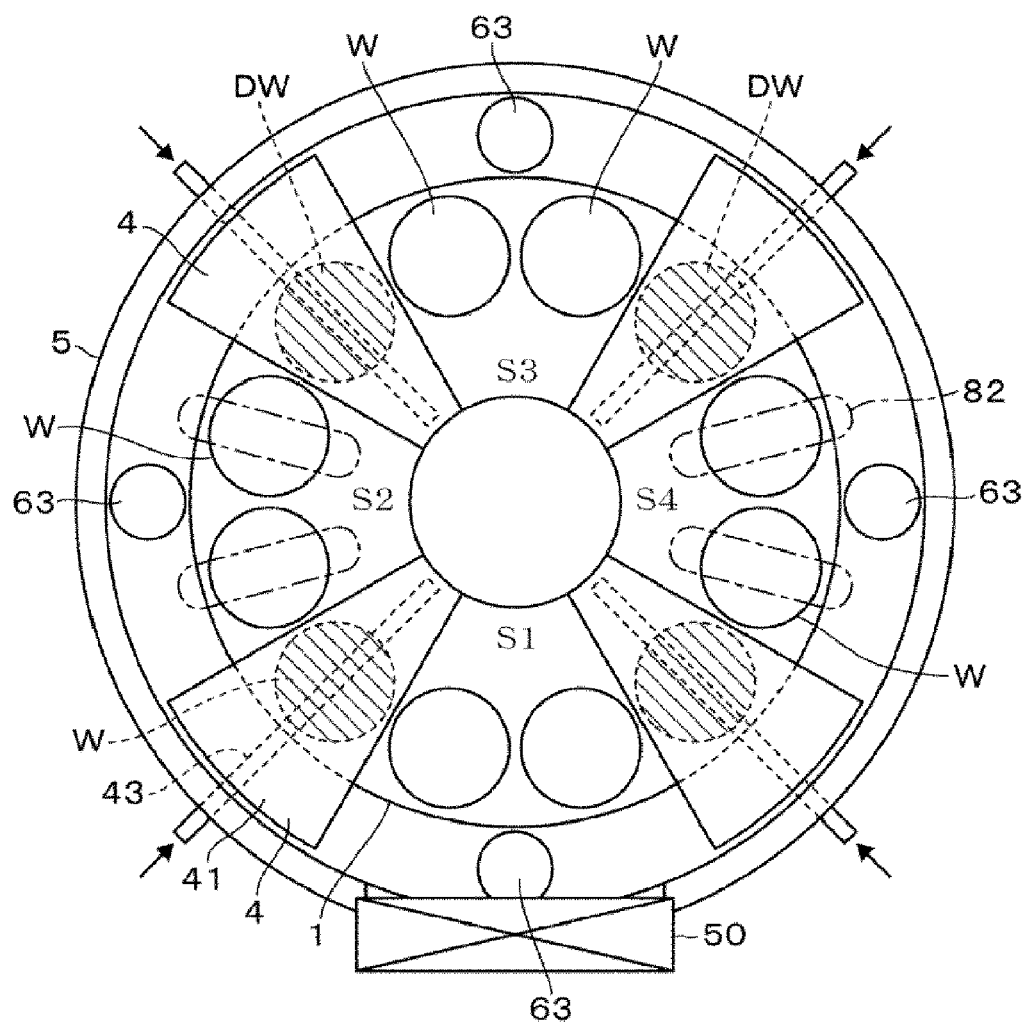
FIG. 20 is a plane view showing an arrangement of wafers when selecting an intermittent rotation mode used in the third embodiment of the present disclosure.

Next, when the intermittent rotation mode is selected, as shown in FIG. 20, the wafers W to be processed are mounted on the mounting tables 2 such that two wafers W to be processed are located in each of the first processing regions S1 and S3 and the second processing regions S2 and S4. In this case, the wafers W to be processed are not mounted on mounting tables 2 located in the isolation parts 4, but dummy wafers DW (wafers indicated by hatching in FIG. 20) are mounted thereon such that mounting tables 2 located in the isolation parts 4 are not emptied. The reason for this is as follows. Although not shown, a purge gas is supplied between the rotary table 1 and the heating part 54. When the wafers W are not mounted on the mounting tables 2 and the supply of the purge gas continues, the purge gas is introduced into process atmosphere through the hole portion 96a through which the lift pins 96 formed in the mounting tables 2 pass. For this reason, the dummy wafers DW are mounted on the mounting tables 2.

In the intermittent rotation mode, the wafers W are processed while stationed in the processing regions S1 to S4. In the continuous rotation mode, the wafers W are processed while being moved in the processing regions S1 to S4. Therefore, the film quality of the silicon nitride film formed in the intermittent rotation mode is better than the film quality in the continuous rotation mode. In contrast, in the continuous rotation mode, the number of mounted wafers W is larger by four than the number of mounted wafers W in the intermittent rotation mode and a process is performed by a continuous rotation. Therefore, in order to obtain the same film thickness, using the continuous rotation mode, the time for which the wafers W stay in the processing container 5 may be shorter than the time in the intermittent rotation mode. Accordingly, the higher throughput is obtained in the continuous rotation mode than in the intermittent rotation mode. Therefore, one of the two modes may be selected according to a wafer lot. For example, the intermittent rotation mode is selected when a priority is given to a high-quality film while the continuous rotation mode can be selected when the priority is given to the throughput.

Figure 21:
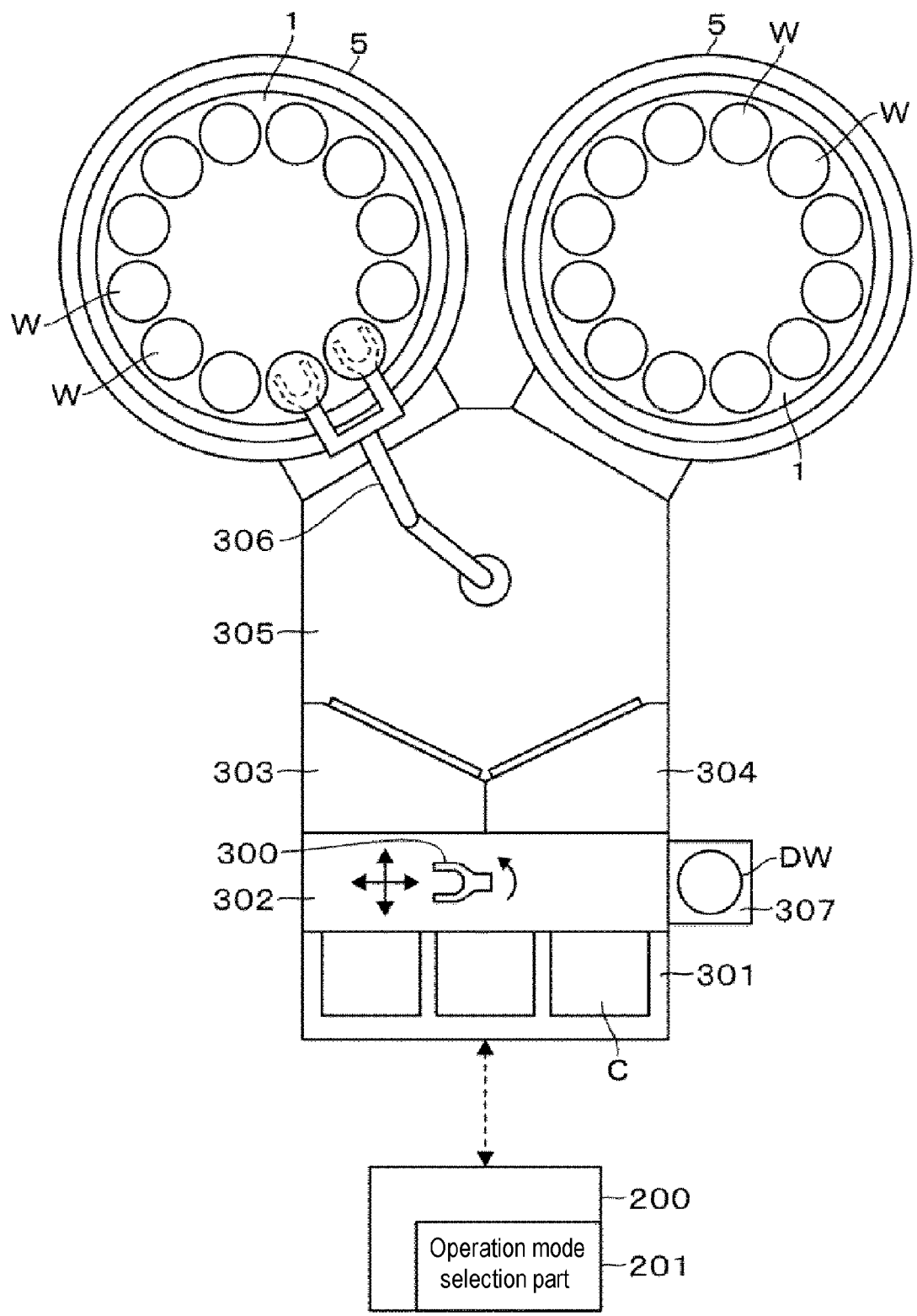
FIG. 21 is a plane view showing a substrate processing system using a film forming apparatus according to the third embodiment of the present disclosure.

Here, a substrate processing system including two film forming apparatuses described above is shown in FIG. 21. In FIG. 21, reference numeral 301 denotes a carrier mounting table, 302 denotes an atmospheric transfer chamber, 300 denotes a first wafer transfer mechanism, 303 and 304 denotes a load-lock chamber, 305 denotes a vacuum transfer chamber, and 306 denotes a second wafer transfer mechanism. In addition, a holding shelf 307 accommodating a plurality of (at least four) dummy wafers DW is installed, for example, at the right side facing the atmospheric transfer chamber 302.

For example, when a carrier C, which is an FOUP accommodating the plurality of wafers W, is loaded onto the carrier mounting table 301, a front cover of the carrier C is removed. Then, the wafers W are taken out by the first wafer transfer mechanism 300 and loaded into the processing container 5 via the load-lock chamber 303 or 304 and the second wafer transfer mechanism 306. For example, the second wafer transfer mechanism 306 holds, for example, two wafers W side by side so that they can be collectively delivered to and from the processing container 5 and the load-lock chamber 303 or 304.

Reference numeral 200 denotes a control unit including an operation mode selection part 201 for selecting the intermittent rotation mode or the continuous rotation mode. When the intermittent rotation mode is selected, the first wafer transfer mechanism 300 takes out the dummy wafers DW, loads them into the processing container 5 according to the above-mentioned path, and mounts them at the positions shown in FIG. 20.

The rotary table 1 used in the above-described embodiments plays a role of transferring heat from the heating part 54 to the wafers W and is configured to be supported by the rotary support 12 for revolving the mounting table 2. However, the rotary table 1 may be fixed. In this case, a plate-like body corresponding to the rotary table 1 functions as a heat transfer plate, but a central portion of the plate-like body may be supported by a support pillar. In this case, as a rotation mechanism for revolving the mounting table 2, a direct drive motor (DD motor) is used so as to surround the periphery of the support pillar. Further, a gap is formed for movement of the rotation axis 21 of the mounting table 2 in the circumferential direction of the heat transfer plate fixed to the support pillar, so that the heat transfer plate is separated into a central portion and an outer ring portion. Therefore, the present disclosure does not necessarily require a rotary table.

The present disclosure is not limited to the film forming process by ALD but may be applied to a case of supplying a first gas into a first processing region to form a first film by a CVD process and then supplying a second gas into a second processing region to form a second film by a CVD process. In this case, a plurality of first films and a plurality of second films are alternately laminated and may be used to manufacture, for example, a three-dimensional NAND circuit. In this case, when two kinds or three or more kinds of gases are used as the first gas, these gases correspond to the first gas and, when two kinds or three or more kinds of gases are used as the second gas, these gases correspond to the second gas. It is to be noted that the rotation of the rotary table 1 is not limited to intermittent rotation in one direction but may alternate between a clockwise rotation and a counterclockwise rotation.

According to the present disclosure in some embodiments, in carrying out a film forming process by mounting a substrate on a mounting part disposed in a processing container and alternately supplying a first gas and a second gas which are process gases, a plurality of sets of first processing regions and second processing regions are formed along the circumferential direction of the processing container with isolation parts interposed therebetween. Then, when the mounting part is stopped, the mounting part is set so that the same number of substrates are located in each of the first processing regions and the second processing regions, and is intermittently revolved for a film forming process so that the substrates are alternately located in the first processing regions and the second processing regions in a state where the revolution is stopped. Therefore, when the revolution of the mounting part is stopped, the film forming process can be performed simultaneously at a plurality of locations by using the first gas and the second gas, thereby achieving high productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for forming a thin film on a substrate in a processing container under a vacuum atmosphere by performing a cycle a predetermined number of times, the cycle including alternately supplying a first gas and a second gas, which are process gases, onto the substrate, comprising:

n first processing regions (n being an integer of 2 or more) which are spaced from each other along a circumferential direction of the processing container, and are used to process the substrate by supplying the first gas;

n second processing regions which are formed between the n first processing regions along the circumferential direction, and are used to process the substrate by supplying the second gas;

an isolation part which isolates the n first processing regions and the n second processing regions from each other;

a plurality of mounting parts which are disposed to be revolved along the circumferential direction and are used to mount substrates, respectively; and a control part configured to intermittently revolve the plurality of mounting parts so that the substrates are alternately located in the n first processing regions and the n second processing regions in a state where a revolution is stopped, wherein the plurality of mounting parts are disposed so that a first number of substrates located in the n first processing regions is the same as a second number of substrates located in the n second processing regions in a state where the revolution of the plurality of mounting parts is stopped.

2. The apparatus of claim 1, wherein the first gas is a precursor gas which is a thin film precursor to be adsorbed on the substrate, and the second gas is a reaction gas reacting with the precursor gas to generate a reaction product.

3. The apparatus of claim 1, wherein a first gas supply time for supplying the first gas required in the n first processing regions is different from a second gas supply time for supplying the second gas required in the n second processing regions, and a rotary table is stopped in accordance with a longer gas supply time of the first gas supply time and the second gas supply time.

4. The apparatus of claim 3, wherein the first gas supply time is set shorter than the second gas supply time when the time for which the required first gas is supplied is shorter than the time for which the required second gas is supplied, and the second gas supply time is set shorter than the first gas supply time when the time for which the required second gas is supplied is shorter than the time for which the required first gas is supplied.

5. The apparatus of claim 1, further comprising a rotation mechanism configured to rotate each of the plurality of mounting parts with respect to a rotation axis of each of the plurality of mounting parts, wherein the substrates are mounted on the plurality of mounting parts, and each of the plurality of mounting parts is rotated with respect to the rotation axis of each of the plurality of mounting parts at least when the process gases is supplied onto the substrates.

6. The apparatus of claim 1, further comprising a rotary table which is rotated on an axis of the rotary table in the circumferential direction of the processing container, wherein the plurality of mounting parts are disposed on an upper surface of the rotary table.

7. The apparatus of claim 1, wherein the substrates are alternately stopped in the n first processing regions and the n second processing regions in an intermittent rotation mode by intermittently revolving the plurality of mounting parts, and the substrates are successively passed through the n first processing regions and the n second processing regions in a continuous rotation mode by continuously revolving the plurality of mounting parts, and
wherein the control part is configured to select one of the intermittent rotation mode and the continuous rotation mode.

8. The apparatus of claim 7, wherein, when the first number of substrates and the second number of substrates are the same, a number of the plurality of mounting parts is set so that the plurality of mounting parts of the substrates are located in the isolation part, and
wherein, when the continuous rotation mode is selected, the substrates are mounted on all of the plurality of mounting parts.

9. The apparatus of claim 8, further comprising lift pins delivering the substrates to and from an external substrate transfer mechanism, and being ascended/descended through a plurality of through holes formed in the plurality of mounting parts,
wherein, when the intermittent rotation mode is selected, the control part outputs a control signal to mount dummy substrates on the plurality of mounting parts located in the isolation part when the first number of substrates and the second number of substrates are the same, in order to block the through-holes of the plurality of mounting parts.

10. A method of forming a thin film on a substrate in a processing container under a vacuum atmosphere by alternately supplying a first gas and a second gas, which are process gases, a predetermined number of times onto the substrate, the method comprising:
forming, in the processing container, n first processing regions (n being an integer of 2 or more) spaced from each other along the circumferential direction of the processing container and n second processing regions along the circumferential direction with an isolation part interposed between the n first processing regions and the n second processing regions;
installing 2n×m (m being an integer of 1 or more) mounting parts which are disposed to be revolved along a circumferential direction and are used to mount substrates, respectively; and
repeating a cycle a predetermined number of time, the cycle including:
(1) mounting the substrates on the mounting parts;
(2) supplying a first gas and a second gas, which are process gases, into the n first processing regions and the n second processing regions, respectively, in a state where a revolution of the mounting parts is stopped so that the substrates are located in each of the n first processing regions and the n second processing regions;
subsequently revolving the mounting parts to locate the substrates, which were located in each of the n first processing regions and the n second processing regions, in adjacent processing regions; and
thereafter supplying the first gas and the second gas into the n first processing regions and the n second processing regions, respectively, in a state where the revolution of the mounting parts is stopped.

11. The method of claim 10, wherein the first gas is a precursor gas which is a thin film precursor to be adsorbed on the substrates, and the second gas is a reaction gas reacting with the precursor gas to generate a reaction product.

12. The method of claim 10, wherein the substrates are mounted on the mounting parts, and each of the mounting parts is rotated with respect to a rotation axis of each of the mounting parts at least in a state where the process gases are supplied onto the substrates.

13. The method of claim 10, wherein the substrates are alternately stopped in the n first processing regions and the n second processing regions in an intermittent rotation mode by intermittently revolving the plurality of mounting parts, and the substrates successively pass through the n first processing regions and the n second processing regions in a continuous rotation mode by continuously revolving the mounting parts, and
wherein one of the intermittent rotation mode and a continuous rotation mode is selected to perform a film forming process on a substrate, and then the other of the intermittent rotation mode and the continuous rotation mode is selected to perform a film forming process on the subsequent substrate.

14. A non-transitory computer-readable storage medium storing a computer program used for a film forming apparatus for forming a thin film on a substrate in a processing container forming a vacuum atmosphere by performing a cycle a predetermined number of times, the cycle including alternately supplying a first gas and a second gas, which are process gases, onto the substrate, the computer program comprising a group of steps so as to execute the film forming method of claim 10.

* * * * *